United States Patent [19]
Kaneko

[11] Patent Number: 6,081,699
[45] Date of Patent: Jun. 27, 2000

[54] FM MULTIPLEX BROADCASTING RECEIVER FOR RECEIVING RDS AND DARC SIGNALS

[75] Inventor: Hiroshi Kaneko, Gunma-Ken, Japan

[73] Assignee: Sanyo Electric Co., Ltd., Osaka, Japan

[21] Appl. No.: 09/044,619

[22] Filed: Mar. 19, 1998

[30] Foreign Application Priority Data

Mar. 28, 1997 [JP] Japan .................................. 9-078318

[51] Int. Cl.[7] ............................... H04B 7/00; H04B 1/18
[52] U.S. Cl. ...................... 455/186.1; 455/265; 455/45; 455/260
[58] Field of Search .................................. 455/260, 265, 455/259, 257, 185.1, 186.1, 45, 152.1; 381/2

[56] References Cited

U.S. PATENT DOCUMENTS

| | | | |
|---|---|---|---|
| 4,688,263 | 8/1987 | Aldridge | 455/142 |
| 5,142,692 | 8/1992 | Owen | 455/45 |
| 5,930,697 | 7/1999 | Böhme et al. | 455/260 |
| 5,960,328 | 8/1999 | Kimura et al. | 455/45 |
| 5,969,634 | 10/1999 | Takashima et al. | 340/825.44 |

FOREIGN PATENT DOCUMENTS

| | | | |
|---|---|---|---|
| 0701341 A2 | 3/1996 | European Pat. Off. | H04H 1/00 |
| 0735787 A2 | 10/1996 | European Pat. Off. | H04Q 7/18 |

OTHER PUBLICATIONS

European Search Report on application No. EP 98 30 2342, Nov. 1998.

Primary Examiner—Edward F. Urban
Assistant Examiner—Rafael Perez-Gutierrez
Attorney, Agent, or Firm—Cantor Colburn LLP

[57] ABSTRACT

A receiver is provided capable of receiving both RDS (Radio Data System) and DARC (DAta Radio Channel) system FM multiplex broadcasting. An RDS signal demodulating circuit is provided with a PLL circuit which comprising a first frequency divider for dividing an output of a crystal oscillator, a phase comparator for inputting an output of the first frequency divider, a low-pass filter connected with the phase comparator, a VCO connected with the low-pass filter, and a second frequency divider for dividing an output of the VOC and outputting the divided output signal to the phase comparator. An output of the VCO is transmitted as a reference clock RDSCL for demodulation of an RDS signal.

7 Claims, 2 Drawing Sheets

FM MULTIPLEX BROADCASTING RECEIVER FOR RECEIVING RDS AND DARC SIGNALS

BACKGROUND OF THE INVENTION

1. Field of the Invention

The present invention relates to a receiver which is capable of receiving both RDS (Radio Data System) or DARC (DAta Radio Channel) FM multiplex broadcasting signals.

2. Description of the Related Art

In FM multiplex-broadcasting, the RDS system is common in Europe, while the DARC system prevails in Japan.

A typical RDS signal demodulating circuit 1, such as shown in FIG. 2, is composed of a bandpass filter BPF 2 for passing only signal components in a band centering around 57 kHz of an RDS modulated signal received, a BPSK demodulator 3 for performing BPSK demodulation of an output signal of the bandpass filter BPF 2, an RDS synchronous regeneration circuit 4 for performing synchronous regeneration based on a demodulated signal, an RDS error correction circuit 5 for detecting errors of RDS data demodulated, correcting these errors, and outputting the corrected RDS data, and a crystal oscillator 7 which generates a reference clock RDSCL due to the connection with a crystal resonator 6. As the bit rate of an RDS signal is 1.1875 Kbps, a frequency of 4.332 MHz, or 3648 times the bit rate, is commonly used for the crystal resonator 6.

On the other hand, a typical DARC signal demodulating circuit 10, such as shown in FIG. 3, is composed of a bandpass filter BPF 12 for passing only a band centering around 76 kHz of a DARC modulated signal received, an MSK demodulator 13 for performing MSK demodulation of an output signal of the bandpass filter BRF 12, a DARC synchronous regeneration circuit 14 for performing synchronous regeneration based on the demodulated signal, a DARC error correction circuit 14 for detecting errors of DARC data demodulated, correcting them, and outputting the DARC data corrected, and a crystal oscillator 17 for generating reference clocks DARCCLs by the connection of a crystal resonator 16. Here, since the bit rate of a DARC signal is 16 Kbps, a frequency of 7.2 MHz, which is 450 times this bit rate, is generally used for the crystal resonator 16.

Thus, in order for a receiver to receive FM multiplex broadcasting of both the RDS and the DARC system, it is now necessary to install in the receiver both the RDS signal demodulating circuit 1 and the DARC signal demodulating circuit 10 which are shown in FIGS. 2 and 3, and two crystal resonators 6 and 16 for generating reference clocks.

Also, FM multiplex broadcasting using both the RDS and DARC systems in a single radio station is about to commence in Europe. Receivers having a constitution similar to the above will be required to listen to broadcasts from such a station.

As described above, in order for a receiver to receive FM multiplex broadcasting of both the RDS and the DARC systems, separate crystal resonators applicable to the respective systems are required along with separate demodulating circuits applicable to each system. A relatively large number of components of are therefore required for these circuits. Further, because the reference clock frequencies of the RDS and DARC systems differ (4.332 MHz vs. 7.2 MHz), it is difficult to simply use a single, common crystal resonator.

Further, if the demodulating circuit is converted into an LSI, the crystal resonators must still be externally installed. The number of external components therefore undesirably increases.

SUMMARY OF THE INVENTION

The present invention is conceived to provide a receiver of simple constitution capable of receiving FM multiplex broadcasts in either or both of the RDS or DARC systems.

In order to achieve this object, an FM multiplex broadcasting receiver according to the present invention includes a DARC signal demodulating circuit and an RDS signal demodulating circuit. The DARC signal demodulating circuit includes a crystal oscillator which generates a reference clock for demodulating DARC signals, while the RDS signal demodulating circuit includes a clock generating circuit for generating a reference clock for demodulating RDS signals from a signal of the crystal oscillator.

According to one aspect, the clock generating circuit is a PLL circuit which comprises a first frequency divider for dividing an output of the crystal oscillator, a phase comparator connected with the first frequency divider, a VCO connected with the phase comparator, and a second frequency divider connected with the VCO for dividing an output of the VCO and then forwarding the output to the phase comparator. The output of the VCO is used as a reference clock for demodulation of the RDS signal.

According to this aspect, the ratio of the frequency division number of the first frequency divider to the second frequency divider is set equal to the ratio of the frequency of the reference clock for demodulation of the DARC signal to the frequency of the reference clock for demodulation of the RDS signal.

Although in this aspect, the DARC signal demodulating circuit and the RDS signal demodulating circuit are composed of distinct LSIs, these circuits may also be composed of a single LSI.

PREFERRED EMBODIMENT OF THE PRESENT INVENTION

Figure 1:
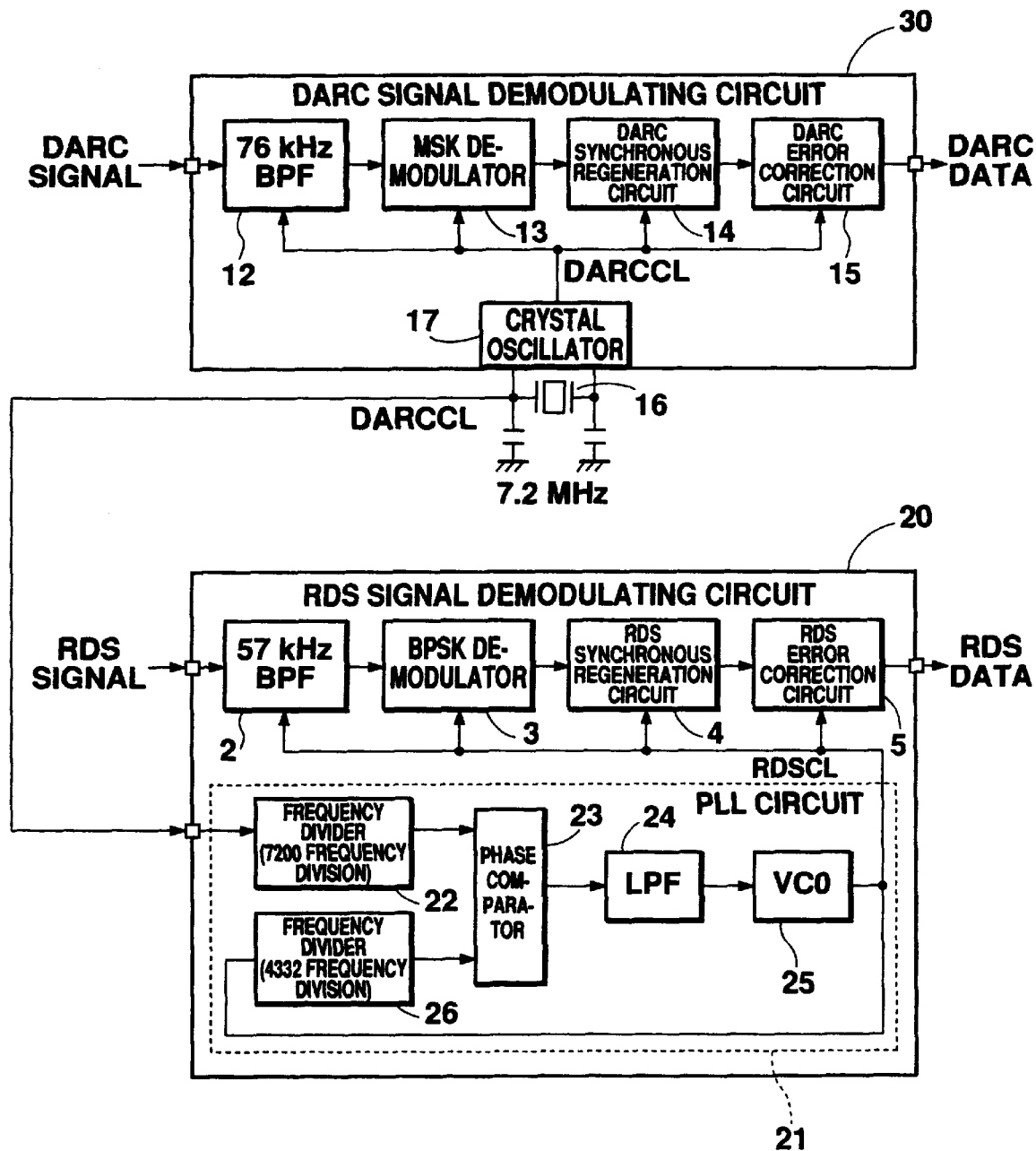
FIG. 1 is a block diagram showing the configuration of a receiver according to a preferred embodiment of the present invention.

FIG. 1 is a block diagram showing an embodiment of the present invention. More specifically, FIG. 1 shows the principal part of a receiver capable of receiving FM multiplex broadcasting of both the RDS and DARC systems.

Figure 3:
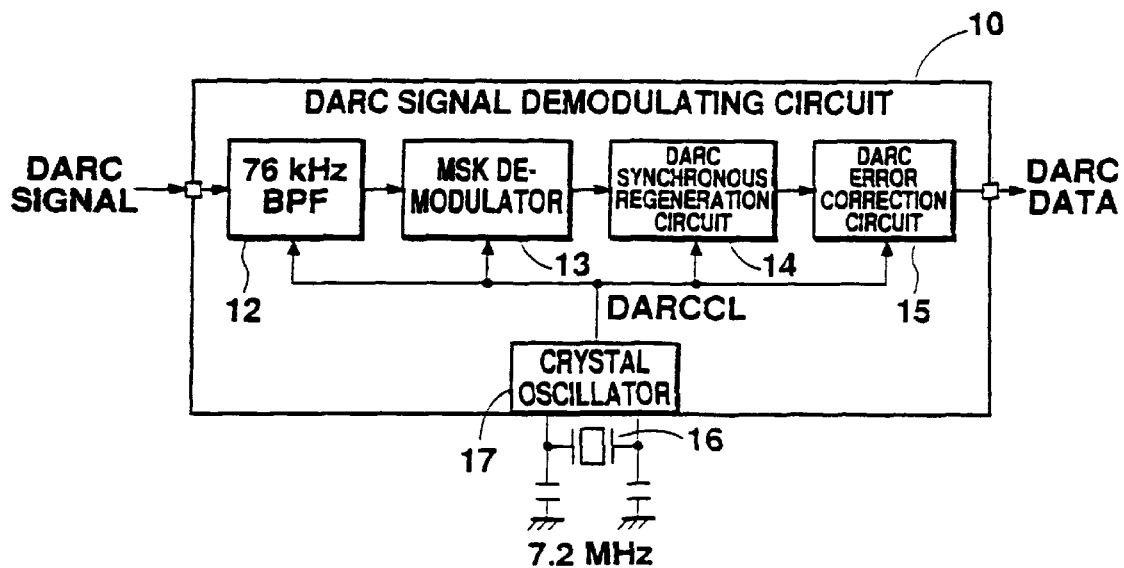
FIG. 3 is a block diagram showing the constitution of a DARC signal demodulating circuit of the related art.

The receiver shown in FIG. 1 comprises an RDS signal demodulating circuit 20 in LSI form and a DARC signal demodulating circuit 30 which also in the form of an LSI. The constitution of the DARC signal demodulating circuit 30 is the same as the constitution shown in FIG. 3. More specifically, the DARC signal demodulating circuit 30 comprises a 76 kHz bandpass filter 12., a MSK demodulator 13, a DARC synchronous regeneration circuit 14, a DARC error correction circuit 15, and a crystal oscillator 17. A crystal resonator of 7.2 MHz 16 for generating a reference clock DARCCL is connected as an external component.

Figure 2:
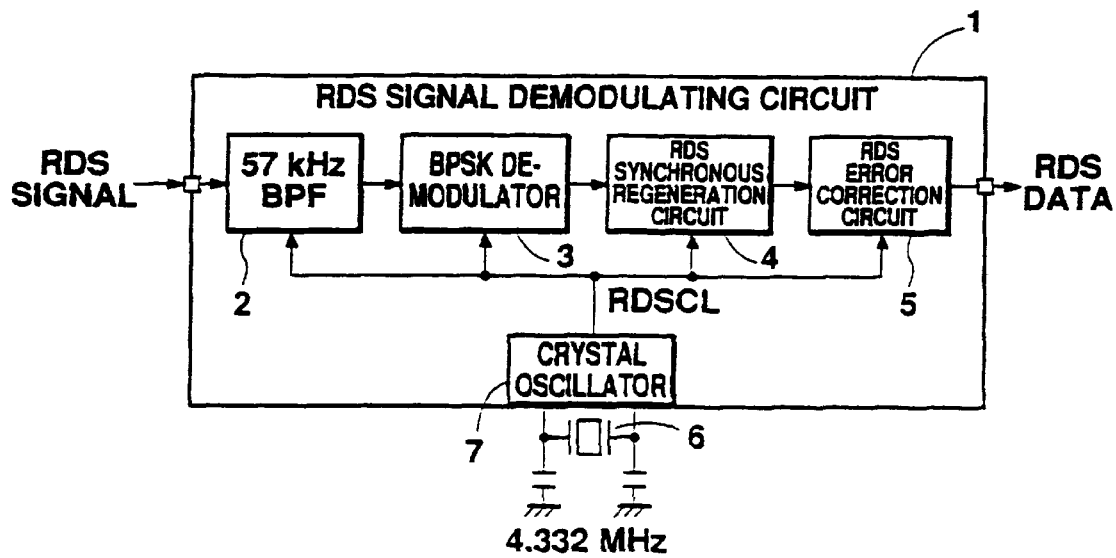
FIG. 2 is a block diagram showing the constitution of an RDS signal demodulating circuit of the related art.

The RDS signal demodulating circuit 20 meanwhile comprises a 57 kHz bandpass filter 2, a BPSK demodulator 3, an RDS synchronous regeneration circuit 4, and an RDS error correction circuit 5,, all corresponding to the RDS signal demodulating circuit shown in FIG. 2. However, unlike the circuit shown in FIG. 2, the RDS signal demodulating circuit 20 further comprises a PLL circuit 21. Still further, the external 4.332 MHz crystal resonator is not connected, and instead a reference clock DARCCL of 7.2 MHz is input from the crystal resonator for DARC 16. The 7.2 MHz reference clock DARCCL is input to a first frequency divider 22 of the PLL circuit 21, and a frequency dividing signal of the first frequency divider 22 is supplied to an input terminal on one side of a phase comparator 23. A low-pass filter 24 is connected on the rear side of the phase comparator 23, and an output of the low-pass filter 24 is input to a VCO 25. A second frequency divider 26 is connected with the VCO 25, and an output of the second frequency divider 26 is supplied to an input terminal of the other side of the phase comparator 23.

Here, the number of frequency division of the first frequency divider 22 is set to 7200 and that of the second frequency divider 26 is set to 4332. Therefore, a 7.2 MHz reference clock DARCCL is divided by the first frequency divider 22 to become a frequency division signal of 7.2 MHz÷7200=1 kHz. In the PLL circuit 21, control is performed so that a dividing signal frequency of the second frequency divider coincides with a dividing signal frequency of 1 kHz. Since the number of frequency division of the second frequency divider 26 is 4332 as described above, if the dividing signal frequency of the second frequency divider 26 becomes 1 kHz, the output signal frequency of the VCO 25 before frequency division is made becomes 1 kHz×4332=4.332 MHz. More specifically, the PLL circuit 21 generates a reference clock RDSCL of 4.332 MHz for demodulation of an RDS signal from a reference clock DARCCL for demodulation of a DARC signal. The reference clock RDSCL of 4.332 MHz is then supplied to each component inside the RDS signal demodulating circuit from the VCO 25.

It therefore is unnecessary to include a 4.332 MHz crystal resonator 6 as an external component. The two condensers and the crystal resonator 7 which are connected with the crystal resonator of 4.332 MHz may also be eliminated, although they are required in the circuit shown in FIG. 2.

Although in the embodiment described above, the RDS signal demodulating circuit and the DARC signal demodulating circuit are composed of separate LSIs, the present invention may of course be formed such these circuits are composed of a single LSI.

According to the present invention, a reference clock for demodulation of a RDS signal is produced from a reference clock for demodulation of a DARC signal. Thus, it is not necessary to include a crystal resonator for the RDS and condensors connected to the crystal resonator. The number of external components can therefore be decreased if a circuit is converted into an LSI.

What is claimed is:

1. A FM multiplex broadcasting receiver comprising:
   a DARC signal demodulating circuit; and
   a RDS signal demodulating circuit, wherein:
   said DARC signal demodulating circuit comprises a crystal oscillator which generates a reference clock for demodulating DARC signals, and said RDS signal demodulating circuit comprises a clock generating circuit for generating a reference clock based on a signal of said crystal oscillator for demodulating RDS signals.

2. The FM multiplex broadcasting receiver according to claim 1, wherein said clock generating circuit is a PLL circuit.

3. The FM multiplex broadcasting receiver according to claim 2, wherein said PLL circuit comprising:
   a first frequency divider for dividing an output of said crystal oscillator;
   a phase comparator connected with said first frequency divider;
   a VCO connected with said phase comparator; and
   a second frequency divider connected with said VCO for dividing an output of said VCO and forwarding the output to said phase comparator, wherein:
   an output of said VCO is a reference clock for demodulating said RDS signal.

4. The FM multiplex broadcasting receiver according to claim 3, wherein the ratio of the frequency division value of said first frequency divider to the value of said second frequency divider is set to the ratio of the frequency of the reference clock for demodulation of said DARC signal to the frequency of the reference clock for demodulation of said RDS signal.

5. The FM multiplex broadcasting receiver according to claim 4, wherein the value of frequency division of said first frequency divider is 7200 and the value of frequency division of said second frequency divider is 4332.

6. The FM multiplex broadcasting receiver according to claim 1, wherein said DARC signal demodulating circuit and said RDS signal demodulating circuit are composed of LSIs.

7. The FM multiplex broadcasting receiver according to claim 1, wherein said DARC signal demodulating circuit and said RDS signal demodulating circuit are composed of a single LSI.

* * * * *